United States Patent
Liang et al.

(10) Patent No.: US 9,570,287 B2
(45) Date of Patent: Feb. 14, 2017

(54) FLOWABLE FILM CURING PENETRATION DEPTH IMPROVEMENT AND STRESS TUNING

(71) Applicant: Applied Materials, Inc., Santa Clara, CA (US)

(72) Inventors: Jingmei Liang, San Jose, CA (US); Jung Chan Lee, Sunnyvale, CA (US); Yong Sun, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/577,943

(22) Filed: Dec. 19, 2014

(65) Prior Publication Data

US 2016/0126089 A1     May 5, 2016

Related U.S. Application Data

(60) Provisional application No. 62/072,217, filed on Oct. 29, 2014.

(51) Int. Cl.
| | |
|---|---|
| *H01L 21/469* | (2006.01) |
| *H01L 21/02* | (2006.01) |
| *C23C 16/34* | (2006.01) |
| *C23C 16/56* | (2006.01) |
| *C23C 16/452* | (2006.01) |

(52) U.S. Cl.
CPC ....... *H01L 21/02164* (2013.01); *C23C 16/345* (2013.01); *C23C 16/56* (2013.01); *H01L 21/0214* (2013.01); *H01L 21/02211* (2013.01); *H01L 21/02274* (2013.01); *H01L 21/02332* (2013.01); *H01L 21/02348* (2013.01); *C23C 16/452* (2013.01)

(58) Field of Classification Search
CPC .................... H01L 21/02164; H01L 21/02211; H01L 21/02271; H01L 21/76825; H01L 21/02126; H01L 21/02203; H01L 21/02337; H01L 21/02348; H01L 21/67115; H01L 21/31111; H01L 21/02326; H01L 21/0234; H01L 21/02219; H01L 21/02274; H01L 21/0214; H01L 21/02332
USPC .................................................. 438/778, 782
See application file for complete search history.

(56) References Cited

U.S. PATENT DOCUMENTS

| 2004/0018319 A1* | 1/2004 | Waldfried | C09D 183/02 427/508 |
|---|---|---|---|
| 2012/0003840 A1* | 1/2012 | Wang | C23C 16/345 438/761 |

* cited by examiner

Primary Examiner — Trung Q Dang
(74) Attorney, Agent, or Firm — Patterson & Sheridan, LLP

(57) ABSTRACT

Methods for depositing and curing a flowable dielectric layer are disclosed herein. Methods can include forming a flowable dielectric layer, immersing the flowable dielectric layer in an oxygen-containing gas, purging the chamber and curing the layer with UV radiation. By curing the layer after an oxygen-containing gas pre-soak, the layer can be more completely cured during the UV irradiation.

20 Claims, 4 Drawing Sheets

FLOWABLE FILM CURING PENETRATION DEPTH IMPROVEMENT AND STRESS TUNING

CROSS-REFERENCE TO RELATED APPLICATIONS

This application claims benefit of U.S. Provisional Patent Application Ser. No. 62/072,217, filed Oct. 29, 2014, which is herein incorporated by reference.

BACKGROUND

Field

Embodiments of the present disclosure generally relate to increasing UV penetration in flowable layers. More specifically, embodiments described herein generally relate to methods for pretreating a flowable layer for increased curing efficiency.

Description of the Related Art

Semiconductor device geometries have dramatically decreased in size since their introduction several decades ago. Modern semiconductor fabrication equipment is routinely used to produce devices having geometries as small as 28 nm and less, and new equipment designs are continually being developed and implemented to produce devices with even smaller geometries. As device geometries decrease, the impact of interconnect capacitance on device performance increases. To reduce interconnect capacitance, inter-layer materials that have traditionally been formed of silicon oxide are being formed using lower dielectric constant materials (low k materials). Some low k materials that have been used include fluorinated silicon oxide, carbonated silicon oxide, and various polymers and aerogels. Use of these low k materials often presents serious reliability, manufacturability, and/or integration challenges.

Over the years, many techniques have been developed to avoid having dielectric material clog the top of a gap, or to "heal" the void or seam that has been formed. One approach has been to start with highly flowable precursor materials that may be applied in a liquid phase to a spinning substrate surface (e.g., spin on glass deposition techniques). These flowable precursors can flow into and fill very small substrate gaps without forming voids or weak seams. However, once these highly flowable materials are deposited, they have to be hardened into a solid dielectric material.

In many instances, the hardening process for flowable materials includes a non-thermal curing under UV lights, to further crosslink the materials into a film, before furnace conversion and densification. With UV exposure, the film density and Si—Si bonds increase. As the surface is the first region of the film to come in contact with the UV radiation, the optical property of the film changes at the surface first. The reflective index and extinction coefficient increase for the surface layer, and this blocks or reduces UV intensity in the bulk film.

Accordingly, devices and methods for better controlling the UV cure process are desirable.

SUMMARY

Embodiments disclosed herein include methods of depositing a flowable dielectric layer. In one embodiment, a method of depositing a layer can include forming a flowable dielectric layer on a substrate, the substrate being positioned in a processing region of a process chamber; delivering an oxygen-containing gas to the substrate and the processing region, the flowable dielectric layer being immersed in the oxygen-containing gas for a period of time creating a soaked dielectric layer; purging the oxygen-containing gas from the processing region after the period of time; and exposing the soaked dielectric layer to UV radiation, wherein the UV radiation at least partially cures the soaked dielectric layer.

In another embodiment, a method for processing a substrate can sequentially include depositing a flowable dielectric layer having a dielectric constant of less than about 2.5 on a substrate surface of a substrate in a process chamber, the substrate surface having a substrate surface area; flowing an oxygen-containing gas into the process chamber at a flow rate of between about 3.1 sccm to about 10.6 sccm per square mm of substrate surface area; terminating flow of the oxygen-containing gas into the UV processing chamber; transferring the substrate to an ultraviolet (UV) processing chamber; and exposing the flowable dielectric layer to UV radiation.

In another embodiment, a method of curing a layer can include providing a carbon-free silicon precursor to a process chamber, the process chamber comprising a processing region with a substrate positioned therein, the substrate having a substrate surface with a substrate surface area; providing a radical-nitrogen precursor to the process chamber; mixing and reacting the carbon-free silicon precursor and the radical-nitrogen precursor to deposit a flowable silicon-and-nitrogen containing layer on the substrate surface, the flowable silicon-and-nitrogen containing layer having a dielectric constant of less than about 2.5; delivering an oxygen-containing gas to the substrate and the process chamber at a flow rate of between about 3.1 sccm to about 10.6 sccm per square mm of substrate surface area, the flowable silicon-and-nitrogen containing layer being immersed in the oxygen-containing gas for a period of time, the oxygen-containing gas comprising ozone ($O_3$); purging the oxygen-containing gas from the processing region using an inert gas; and exposing the flowable silicon-and-nitrogen containing layer to UV radiation, wherein the UV radiation at least partially cures the flowable dielectric layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

A method of forming a dielectric layer is described. The method first deposits an initially-flowable layer on a substrate. The initially-flowable layer is then exposed to a oxygen-containing gas pre-soak prior to densification by UV cure. During the UV cure process, the optical absorbance of the surface can change such that UV penetration to the underlying portions is reduced. The pre soak process reduces this change in optical absorbance, allowing for a more optimal cure of the deposited layer.

The flowable layer may be deposited by a process such as spin-on glass (SOG) spin-on dielectric (SOD), an eHARP process ($H_2O$-TEOS-$O_3$), SACVD or a flowable CVD process such as radical-component CVD. Flowable films can have a reduced density and elevated etch rate compared to non-flowable films. The high density plasma treatments described herein have been found to enable a dramatic reduction of wet etch rate ratio, for example from 3-5 to well below 3.

The examples described herein will focus on deposition of a radical-component CVD silazane film, i.e. silicon-nitrogen-and-hydrogen-containing layer, a oxygen-containing pre-soak, which has been found to improve UV curing of the resulting films, and a subsequent UV treatment. The films may include silicon, hydrogen and nitrogen in some embodiments. The films may include silicon, carbon, oxygen, hydrogen and nitrogen in further embodiments.

Processing chambers that may be used to deposit flowable layers in accordance with embodiments described herein may include high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers. Specific examples include the CENTURA ULTIMA® HDP-CVD chambers/systems, and PRODUCER® PECVD chambers/systems, available from Applied Materials, Inc. of Santa Clara, Calif.

Figure 1:
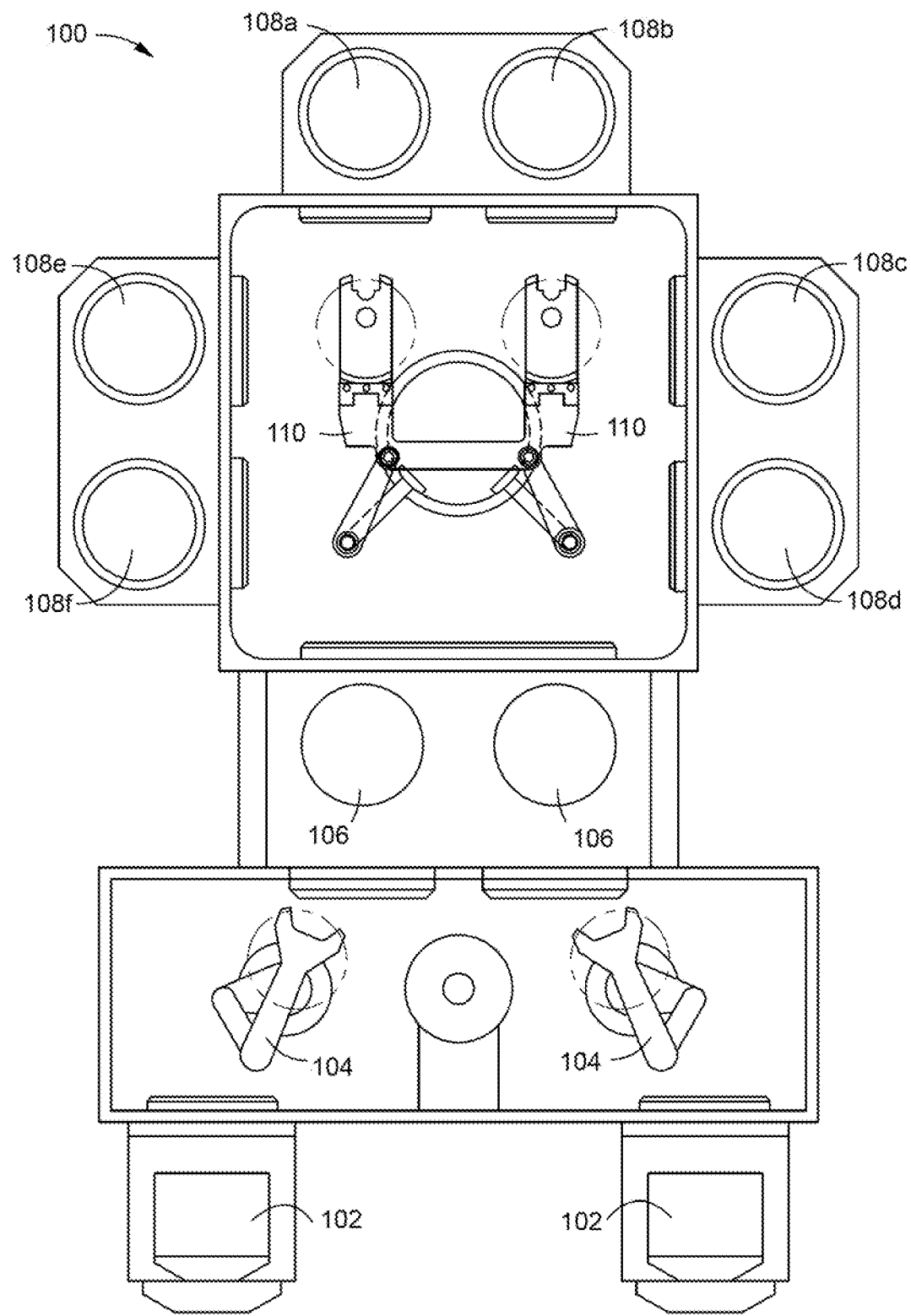
FIG. 1 is a overhead view of one embodiment of a processing system, according to one embodiment.

The processing chambers may be incorporated into larger fabrication systems for producing integrated circuit chips. FIG. 1 shows one such system 100 of deposition, baking, and curing chambers. In the figure, a pair of FOUPs (front opening unified pods) 102 supply, substrates (e.g., 300 mm diameter wafers) that are received by robotic arms 104 and placed into a low pressure holding area 106 before being placed into one of the wafer processing chambers 108*a*-108*f*. A second robotic arm 110 may be used to transport the substrate wafers from the holding area 106 to the processing chambers 108*a*-108*f* and back.

The processing chambers 108*a*-108*f* may include one or more system components for depositing, annealing, curing, and/or etching a flowable dielectric film on the substrate wafer. In one configuration, two pairs of the processing chamber (e.g., 108*c* and 108*d* and 108*e* and 108*f*) may be used to deposit the flowable dielectric material on the substrate, and the third pair of processing chambers (e.g., 108*a* and 108*b*) may be used to anneal the deposited dielectric. In another configuration, the same two pairs of processing chambers (e.g., 108*c* and 108*d* and 108*e* and 108*f*) may be configured to both deposit and anneal a flowable dielectric film on the substrate, while the third pair of chambers (e.g., 108*a* and 108*b*) may be used for UV or E-beam curing of the deposited film. In still another configuration, all three pairs of chambers (e.g., 108*a*-108*f*) may be configured to deposit and cure a flowable dielectric film on the substrate. In yet another configuration, two pairs of processing chambers (e.g., 108*c*-108*d* and 108*e*-108*f*) may be used for both deposition and UV or E-beam curing of the flowable dielectric, while a third pair of processing chambers (e.g. 108*a* and 108*b*) may be used for annealing the dielectric film. Any one or more of the processes described may be carried out on chamber(s) separated from the fabrication system shown in different embodiments.

In addition, one or more of the process chambers 108*a*-108*f* may be configured as a wet treatment chamber. These process chambers include heating the flowable dielectric film in an atmosphere that includes moisture. Thus, embodiments of system 100 may include wet treatment chambers 108*a* and 108*b* and anneal processing chambers 108*c* and 108*d* to perform both wet and dry anneals on the deposited dielectric film.

Figure 2:
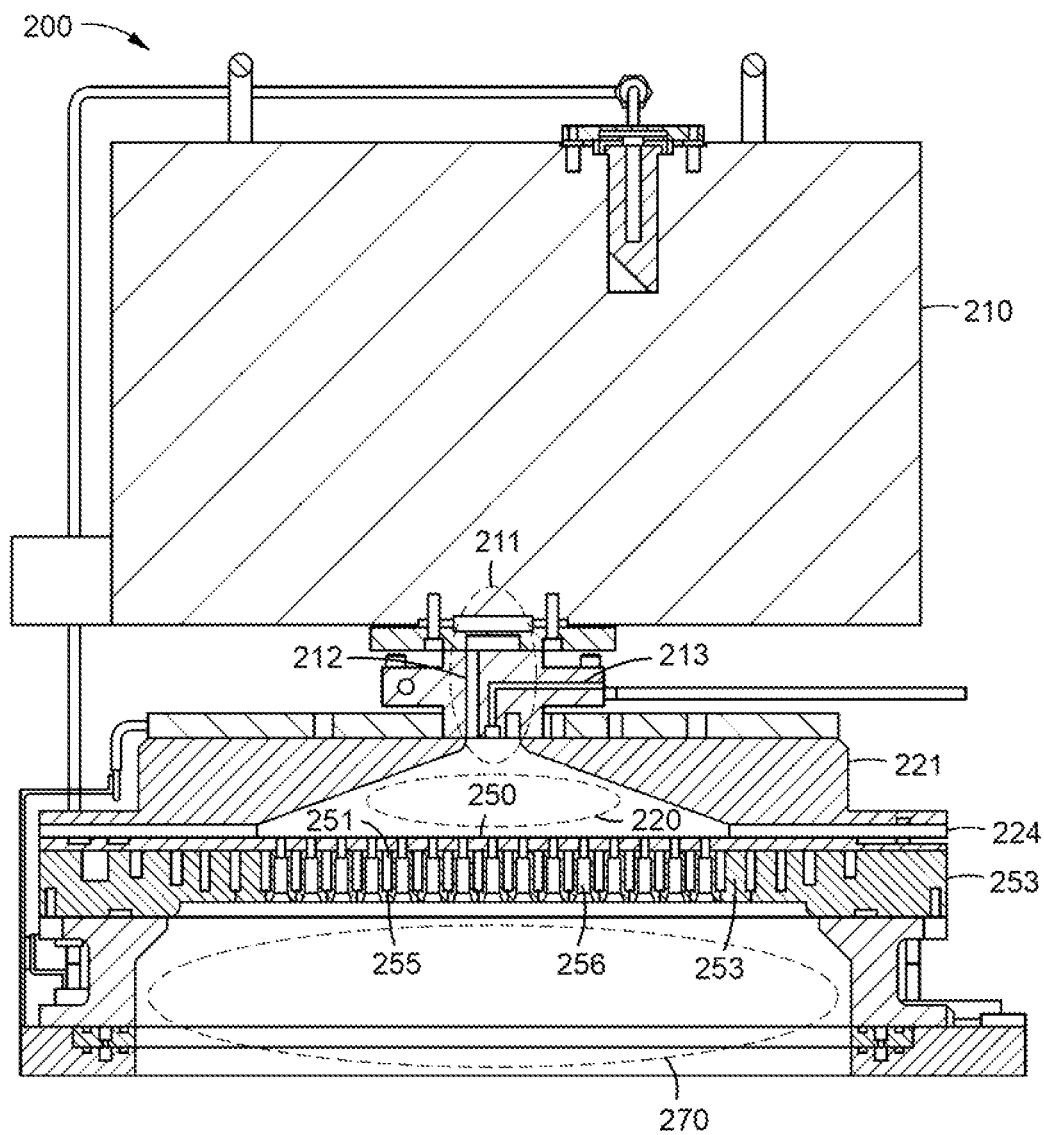
FIG. 2 is a schematic cross-sectional view of one embodiment of a process chamber, according to one embodiment.

FIG. 2 is a substrate processing chamber 200 according to one embodiment. A remote plasma system 210 may process a gas which then travels through a gas inlet assembly 211. Two distinct gas supply channels are visible within the gas inlet assembly 211. A first channel 212 carries a gas that passes through the remote plasma system 210, which a second channel 213 bypasses the remote plasma system 210. A lid 221 and a showerhead 253 are shown with an insulating ring 224 in between, which allows an AC potential to be applied to the lid 221 relative to showerhead 253. The process gas travels through first channel 212 into a chamber plasma region 220 and may be excited by a plasma in the chamber plasma region 220 alone or in combination with the remote plasma system 210. The combination of the chamber plasma region 220 and/or the remote plasma system 210 may be referred to as a remote plasma system herein. The argon and oxygen-containing gas may be transformed to argon and oxygen-containing plasma effluents by the remote plasma system. The showerhead 253 separates the chamber plasma region 220 from a substrate processing region 270 beneath the showerhead 253. The showerhead 253 allows a plasma present in the chamber plasma region 220 to avoid directly exciting gases in the substrate processing region 270, which still allowing excited species, such as the plasma effluents, to travel from the chamber plasma region 220 into the substrate processing region 270.

The showerhead 253 may be a dual-zone showerhead that allows plasma effluents, such as argon and oxygen-containing plasma effluents created within the plasma region 220 into the substrate processing region 270 by passing through a plurality of through holes 256 that traverse the thickness of the showerhead 253. Each through hole 256 may have an opening 250 facing the plasma region 220, and the opening 250 may have a smaller diameter than the diameter of the through hole 256. The showerhead 253 also has one or more hollow volumes 251 which can be filled with a precursor in the form of a vapor or gas (such as the carbon-containing precursor gas) and pass through small holes 255 into the substrate processing region 270 but not directly into the plasma region 220.

In the example shown, showerhead 253 may distribute (via through holes 256) process gases which contain oxygen, hydrogen, nitrogen, and/or plasma effluents of such process gases upon excitation by a plasma in chamber plasma region 220. In some embodiments, the process gas introduced into the RPS 210 and/or chamber plasma region 220 through first channel 212 may contain one or more of oxygen ($O_2$), ozone ($O_3$), $N_2O$, NO, $NO_2$, $NH_3$, $N_xH_y$ including $N_2H_4$, silane, disilane, TSA and DSA. The process gas may also include a carrier gas such as helium, argon, nitrogen ($N_2$), etc. The second channel 213 may also deliver a process gas, a carrier gas, and/or a film-curing gas used to remove an unwanted component from the growing or as-deposited film. Plasma effluents may include ionized or neutral derivatives of the process gas and may also be referred to herein as a radical-oxygen precursors and/or a radical-nitrogen precursor referring to the atomic constituents of the process gas introduced.

The number of through holes 256 may be between about 60 and about 2000. Through holes 256 may have a variety of shapes but are mostly easily made round. The diameter of the opening 250 may be between about 0.5 mm and about 20 mm or between about 1 mm and about 6 mm. There is also latitude in choosing the cross-sectional shape of through holes 256, which may be made conical, cylindrical or a combination of the two shapes. The number of small holes 255 used to introduce a gas into the substrate processing region 270 may be between about 100 and about 5000 or between about 500 and about 2000 in different embodiments. The diameter of the small holes 255 may be between about 0.1 mm and about 2 mm.

Figure 3:
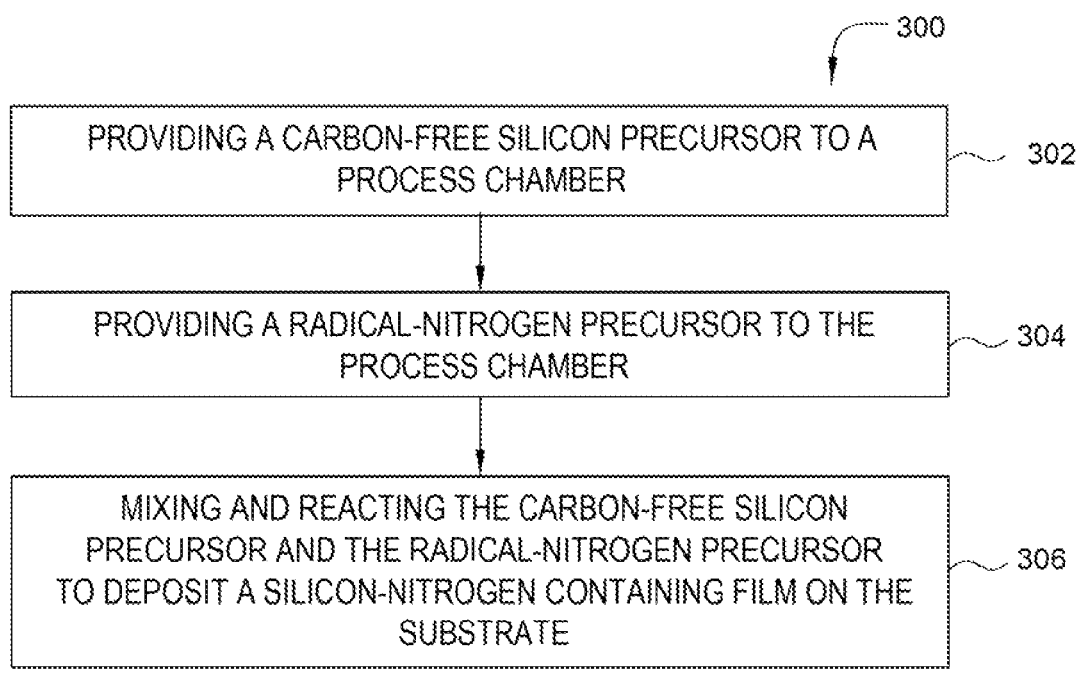
FIG. 3 is a block diagram of a method of depositing a flowable layer, according to one embodiment.

FIG. 3 is a flowchart showing selected steps in methods 300 of making a flowable film, such as a silicon nitride film, according to embodiments described herein. The method 300 includes providing a carbon-free silicon precursor to a reaction chamber at 302. The carbon-free silicon precursor may be, for example, a silicon-and-nitrogen precursor, a silicon-and-hydrogen precursor, or a silicon-nitrogen-and-hydrogen containing precursor, among other classes of silicon precursors. Specific examples of these precursors may include silyl-amines such as $H_2N(SiH_3)$, $HN(SiH_3)_2$, and $N(SiH_3)_3$, among other silyl-amines. These silyl-amines may be mixed with additional gases that may act as carrier gases, reactive gases, or both. Examples of additional gases may include $H_2$, $N_2$, $NH_3$, He, and Ar, among other gases. Examples of carbon-free silicon precursors may also include silane ($SiH_4$) either alone or mixed with other silicon-containing gases (e.g., $N(SiH_3)_3$), hydrogen-containing gases (e.g., $H_2$), and/or nitrogen-containing gases (e.g., $N_2$, $NH_3$). Carbon-free silicon precursors may also include disilane, trisilane, higher-order silanes, and chlorinated silanes, alone or in combination with one another or the previously mentioned carbon-free silicon precursors.

The silicon-precursor may be oxygen-free in addition to carbon-free. The lack of oxygen results in a lower concentration of silanol (Si—OH) groups in the silicon-and-nitrogen layer formed from the precursors. Excess silanol moieties in the deposited film can cause increased porosity and shrinkage during post deposition steps that remove the hydroxyl (—OH) moieties from the deposited layer.

A radical-nitrogen precursor is also provided to the reaction chamber at 304. The radical-nitrogen precursor is a nitrogen-radical containing species that was generated outside the reaction chamber from a more stable nitrogen precursor. For example, a relatively stable nitrogen precursor such a $NH_3$ and/or hydrazine ($N_2H_4$) may be activated in a plasma unit outside the reaction chamber to form the radical-nitrogen precursor, which is then transported into the reaction chamber. The stable nitrogen precursor may also be a mixture comprising $NH_3$ & $N_2$, $NH_3$ & $H_2$, $NH_3$ & $N_2$ & $H_2$ and $N_2$ & $H_2$, in different embodiments. Hydrazine may also be used in place of or in combination with $NH_3$ in the mixtures with $N_2$ and $H_2$. The radical-nitrogen precursor produced may be one or more of N, NH, $NH_2$, etc., and may also be accompanied by ionized species formed in the plasma.

Generally speaking, a radical precursor which does not include nitrogen will also allow a silicon-and-nitrogen-containing layer to be formed. A radical precursor may be a radical-nitrogen precursor if it includes nitrogen supplied with the aforementioned precursors to the remote plasma region. The radical precursor is generated in a section of the reaction chamber partitioned from a deposition region where the precursors mix and react to deposit the silicon-and-nitrogen layer on a deposition substrate (e.g., a semiconductor wafer). In an embodiment where the radical precursor is a radical-nitrogen precursor, a stable nitrogen precursor is flowed into the remote plasma region and excited by a plasma. The stable nitrogen precursor (and the radical-nitrogen precursor) may also be accompanied by a carrier gas such as hydrogen ($H_2$), nitrogen ($N_2$), argon, helium, etc. A radical-nitrogen precursor formed from an input gas consisting essentially of nitrogen ($N_2$) (with or without additional inert carrier gases) has also been found to produce beneficial films in disclosed embodiments. The radical-nitrogen precursor may also be replaced by a radical precursor formed from an input gas consisting essentially of hydrogen ($H_2$) (and optionally inert carrier gases) in embodiments where the silicon-containing precursor comprises nitrogen.

In the reaction chamber, the carbon-free silicon precursor and the radical-nitrogen precursor mix and react to deposit a silicon-and-nitrogen containing film on the substrate at 306. The deposited silicon-and-nitrogen-containing film may deposit conformally with some recipe combinations in embodiments. In other embodiments, the deposited silicon-and-nitrogen containing film has flowable characteristics unlike conventional silicon nitride ($Si_3N_4$) film deposition techniques. The flowable nature of the formation allows the film to flow into narrow gaps trenches and other structures on the deposition surface of the substrate.

The flowability may be due to a variety of properties which result from mixing a radical-nitrogen precursors with carbon-free silicon precursor. These properties may include a significant hydrogen component in the deposited film and/or the presence of short chained polysilazane polymers. These short chains grow and network to form more dense dielectric material during and after the formation of the film. For example the deposited film may have a silazane-type, Si—NH—Si backbone (i.e., a Si—N—H film). When both the silicon precursor and the radical-nitrogen precursor are carbon-free, the deposited silicon-and-nitrogen containing film is also substantially carbon-free. Of course, "carbon-free" does not necessarily mean the film lacks even trace amounts of carbon. Carbon contaminants may be present in the precursor materials that find their way into the deposited silicon-and-nitrogen precursor. The amount of these carbon impurities however are much less than would be found in a silicon precursor having a carbon moiety (e.g., TEOS, TMDSO, etc.).

Figure 4:
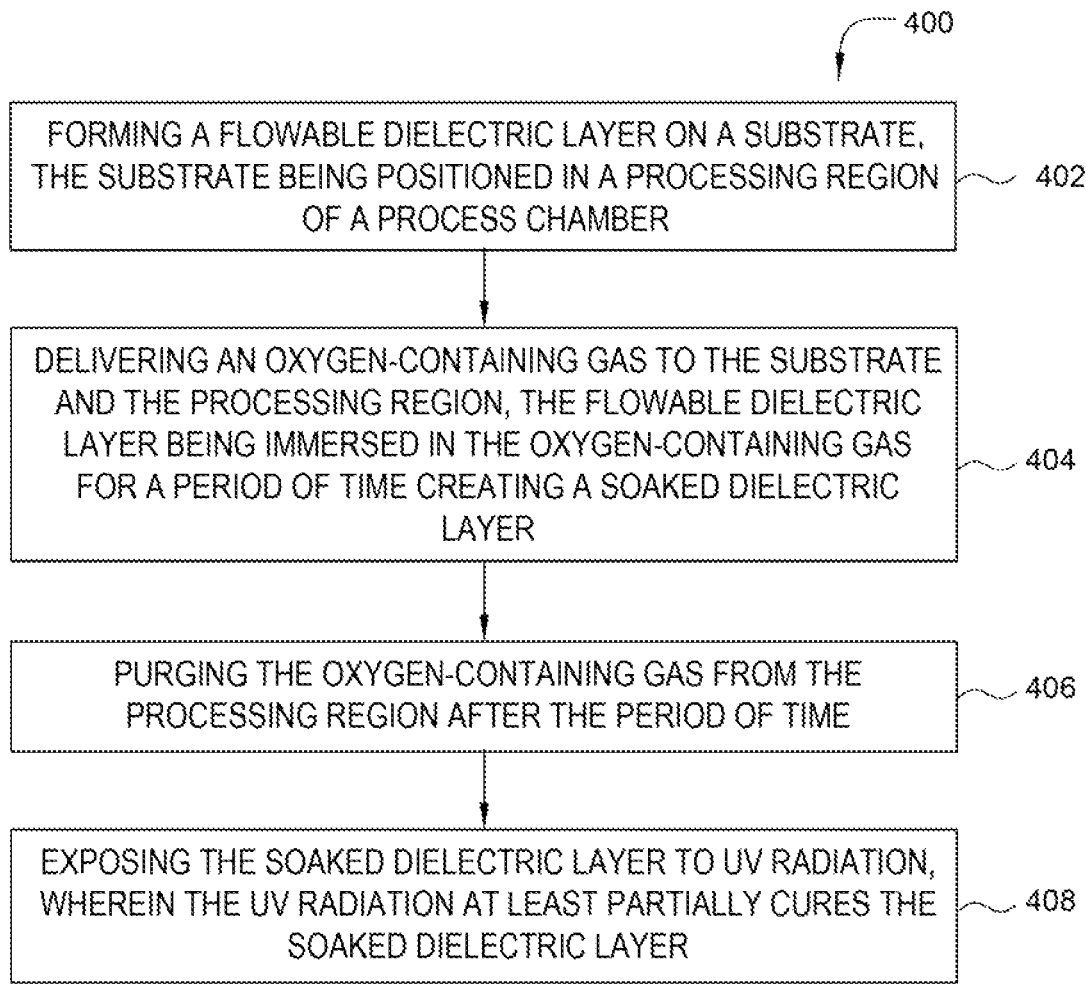
FIG. 4 is a block diagram of a method of curing a flowable layer, according to one embodiment.

FIG. 4 discloses a method 400 for curing a flowable dielectric layer, according to an embodiment. The method 400 includes forming a flowable dielectric layer on a substrate, the substrate being positioned in a processing region of a process chamber, at 402; delivering an oxygen-containing gas to the substrate and the processing region, the flowable dielectric layer being immersed in the oxygen-containing gas for a period of time creating a soaked dielectric layer, at 404; purging the oxygen-containing gas from the processing region after the period of time, at 406; and exposing the soaked dielectric layer to UV radiation, wherein the UV radiation at least partially cures the soaked dielectric layer, at 408. The method 400 allows for more complete curing of the flowable layer by presoaking the flowable layer in an oxygen rich atmosphere prior to curing. The presoak increases the depth of the UV cure by preventing the increase in the refractive index (RI) at the surface of the layer during the UV curing process.

The method 400 begins with forming a flowable dielectric layer on a substrate, at 402. The substrate is first positioned in a processing region of a process chamber. The process chamber can be a process chamber as described with reference to FIG. 2 above. The substrate can be, among others, a thin sheet of metal, plastic, organic material, silicon, glass, quartz, or polymer materials. In one embodiment, the substrate is a silicon substrate upon which a silicon-containing layer will be deposited. In other embodiments, the substrate may be a doped or otherwise modified silicon substrate. The substrate may have a plurality of gaps for the spacing and structure of device components (e.g., transistors) formed on the substrate. The gaps may have a height and width that define an aspect ratio (AR) of the height to the width (i.e., H/W) that is significantly greater than 1:1 (e.g., 5:1 or more, 6:1 or more, 7:1 or more, 8:1 or more, 9:1 or more, 10:1 or more, 11:1 or more, 12:1 or more, etc.). In many instances the high AR is due to small gap widths of that range from about 90 nm to about 22 nm or less (e.g., about 90 nm, 65 nm, 45 nm, 32 nm, 22 nm, 16 nm, etc.).

A flowable dielectric layer, such as a flowable silicon-and-nitrogen containing layer, may be deposited on the substrate. Because the layer is flowable, it can fill gaps with high aspect ratios without creating voids or weak seams around the center of the filling material. For example, a flowable material is less likely to prematurely clog the top of a gap before it is completely filled to leave a void in the middle of the gap.

An oxygen-containing gas is delivered to the substrate and the processing region creating an oxygen-containing gas atmosphere, at 404. The deposited silicon-and-nitrogen containing layer may then be pre-soaked in the oxygen-containing gas atmosphere. The oxygen-containing gas may include substantially pure oxygen in the form of atomic oxygen (O), molecular oxygen ($O_2$), ozone ($O_3$), nitrogen-oxides (NO, $NO_2$, etc) and combinations thereof. The atmosphere may also contain a combination of oxygen and steam ($H_2O$) or hydrogen peroxide ($H_2O_2$). For example, the deposited silicon-and-nitrogen layer may be pre-soaked in an atmosphere containing ozone ($O_3$) and steam ($H_2O$).

The flowable dielectric layer is immersed in the oxygen-containing gas for a period of time creating a soaked dielectric layer. The substrate with the flowable dielectric layer is maintained at a temperature and pressure which allows for penetration of the oxygen-containing gas into the flowable dielectric layer while avoiding premature curing or exceeding the thermal budget of the substrate. In one or more embodiments, the temperature is less than about 150 degrees Celsius, such as less than about 100 degrees Celsius. For example, the temperature can be between about 10 degrees Celsius and about 60 degrees Celsius. In one or more embodiment, the pressure is greater than 100 Torr, such as greater than 200 Torr. For example, the pressure can be between about 500 Torr and 600 Torr. The oxygen-containing gas can be delivered at a flow rate of between about 3 slm and about 10 slm for a 300 mm diameter circular substrate. In one embodiment, the oxygen-containing gas is delivered at a flow rate of between about 3.1 sccm to about 10.6 sccm per square mm of substrate surface area, as measured on the exposed surface (also referred to as the deposition surface) of the substrate.

As stated above, the flowable dielectric layer is immersed in the oxygen-containing gas for a period of time. The period of time can be a time period sufficient for the exchange rate of the oxygen-containing gas in the atmosphere and in the flowable dielectric layer to reach equilibrium. In one embodiment, the period of time is less than about 300 seconds, such as between about 40 seconds and about 240 seconds.

Embodiments may include multiple pre-soak stages with different temperatures, pressures and atmospheres. For example, a first pre-soak stage may be performed at a lower first temperature in an atmosphere that includes steam ($H_2O$), while a second pre-soak stage may be performed at a higher second temperature in a dry oxygen-containing atmosphere which substantially lacks water vapor. In some embodiments, the multiple pre-soak stages contain one or more pre-soak stages which do not use an oxygen-containing atmosphere. For example, a third pre-soak stage may also be conducted in a non-oxygen containing atmosphere (e.g., dry $N_2$, He, Ar, etc.). After the pre-soak is complete, the flowable dielectric layer may also be referred to as the soaked dielectric layer.

After the period of time, the oxygen-containing gas can be purged from the processing region, at 406. The purge can include delivering an inert gas to the process chamber. Inert gas includes any gases which are not reactive with the oxygen-containing gas, the substrate and/or the flowable dielectric layer. Inert gases can include, $N_2$, Ar, He, or combinations thereof. During this process, temperature and pressure can be maintained as described above.

The soaked dielectric layer is exposed to UV radiation, at 408. The UV radiation at least partially cures the soaked dielectric layer. A curing stage involves exposing the soaked dielectric layer to UV radiation. The deposition substrate may remain in the substrate processing region for curing, or the substrate may be transferred to a different chamber where the UV radiation is introduced. The UV radiation creates crosslinking between the Si—O formed during the pre-soak process, the free oxygen-containing gas, the silicon and the nitrogen in the soaked dielectric layer.

It is believed that during UV cure of a flowable dielectric layer, the UV radiation cures the uppermost portion of the layer first. The uppermost portion changes in refractive index during the curing process, preventing further penetration of the UV and simultaneously leading to increased stress in the flowable dielectric layer. The previously formed Si—O bonds in the soaked dielectric layer prevent the change in refractive index in the uppermost portion of the flowable dielectric layer, which increases cure penetration and thus an increased depth of cure. Stated another way, the RI remains more uniform in the soaked dielectric layer over a flowable dielectric layer which does not receive a pre-soak in an oxygen-containing gas.

The previously described embodiments have many advantages. Flowable dielectric layers treated with an oxygen-containing gas pre-soak have the flowability to deposit in high aspect ratio features while maintaining the ability to be fully cured using a low temperature UV radiation cure. Thus, this method can be used to achieve good fill on devices with a low thermal budget and high aspect ratio features. Further, the soaked dielectric layer allows for novel tensile/compressive stress modulation as compared to the pre-existing flowable dielectric layer deposition methods. The aforementioned advantages are illustrative and not limiting. It is not necessary for all embodiments to have all the advantages.

While the foregoing is directed to embodiments of the disclosed apparatus, methods and systems, other and further embodiments of the disclosed apparatus, methods and systems may be devised without departing from the basic scope thereof, and the scope thereof is determined by the claims that follow.

What is claimed is:

1. A method of depositing a layer, comprising:
    forming a flowable dielectric layer on a substrate, the substrate being positioned in a processing region of a process chamber;
    delivering an oxygen-containing gas to the substrate and the processing region, the flowable dielectric layer being immersed in the oxygen-containing gas for a period of time creating a soaked dielectric layer, wherein the oxygen-containing gas penetrates into the flowable dielectric layer while avoiding premature curing of the flowable dielectric layer;
    purging the oxygen-containing gas from the processing region after the period of time; and
    exposing the soaked dielectric layer to UV radiation after the purging the oxygen-containing gas, wherein the UV radiation at least partially cures the soaked dielectric layer.

2. The method of claim 1, wherein the flowable dielectric layer is a silicon and nitrogen containing layer.

3. The method of claim 1, wherein the oxygen-containing gas comprises atomic oxygen (O), ozone ($O_3$), molecular oxygen ($O_2$), nitrogen-oxides, water ($H_2O$) or combinations thereof.

4. The method of claim 1, wherein the temperature of the substrate is maintained at less than 150 degrees Celsius.

5. The method of claim 1, wherein the pressure in the processing region is maintained at greater than 100 Torr.

6. The method of claim 1, wherein the substrate is delivered to a second process chamber prior to exposing the soaked dielectric layer to UV radiation.

7. The method of claim 1, wherein the oxygen-containing gas is delivered to the substrate and the processing region at a flow rate of between about 3.1 sccm to about 10.6 sccm per square mm of substrate surface area.

8. The method of claim 1, wherein the formation of the flowable dielectric layer comprises:
    providing a carbon-free silicon precursor to the processing region;
    providing a radical-nitrogen precursor to the processing region; and
    mixing and reacting the carbon-free silicon precursor and the radical-nitrogen precursor to deposit a flowable dielectric layer on the substrate.

9. The method of claim 1, wherein the soaked dielectric layer is exposed to UV radiation in an inert gas atmosphere.

10. A method for processing a substrate, sequentially comprising:
    depositing a flowable dielectric layer having a dielectric constant of less than about 2.5 on a substrate surface of a substrate in a process chamber, the substrate surface having a substrate surface area;
    flowing an oxygen-containing gas into the process chamber at a flow rate of between about 3.1 sccm to about 10.6 sccm per square mm of substrate surface area to create a soaked dielectric layer, wherein the oxygen-containing gas penetrates into the flowable dielectric layer while avoiding premature curing of the flowable dielectric layer;
    terminating flow of the oxygen-containing gas into the processing chamber;
    transferring the substrate to an UV processing chamber; and
    exposing the soaked dielectric layer to UV radiation in the UV processing chamber.

11. The method of claim 10, wherein the flowable dielectric layer is a silicon and nitrogen containing layer.

12. The method of claim 10, wherein the oxygen-containing gas comprises atomic oxygen (O), ozone ($O_3$), molecular oxygen ($O_2$), nitrogen-oxides, water ($H_2O$) or combinations thereof.

13. The method of claim 10, wherein the temperature of the substrate is maintained at less than 150 degrees Celsius.

14. The method of claim 10, wherein the pressure in the processing region is maintained at greater than 100 Torr.

15. The method of claim 10, further comprising purging the oxygen-containing gas from the process chamber prior to transferring the substrate.

16. The method of claim 10, wherein the soaked dielectric layer is exposed to UV radiation in an inert gas atmosphere.

17. The method of claim 10, wherein the deposition of the soaked dielectric layer comprises:
    providing a carbon-free silicon precursor to the process chamber;
    providing a radical-nitrogen precursor to the process chamber; and
    mixing and reacting the carbon-free silicon precursor and the radical-nitrogen precursor to deposit the soaked dielectric layer on the substrate.

18. A method of depositing a layer, comprising:
    providing a carbon-free silicon precursor to a process chamber, the process chamber comprising a processing region with a substrate positioned therein, the substrate having a substrate surface with a substrate surface area;
    providing a radical-nitrogen precursor to the process chamber;
    mixing and reacting the carbon-free silicon precursor and the radical-nitrogen precursor to deposit a flowable silicon-and-nitrogen containing layer on the substrate surface, the flowable silicon-and-nitrogen containing layer having a dielectric constant of less than about 2.5;
    delivering an oxygen-containing gas to the flowable silicon-and-nitrogen containing layer on the substrate and the process chamber at a flow rate of between about 3.1 sccm to about 10.6 sccm per square mm of substrate surface area, the flowable silicon-and-nitrogen containing layer being immersed in the oxygen-containing gas for a period of time to create a soaked silicon-and-nitrogen containing layer, the oxygen-containing gas comprising ozone ($O_3$), wherein the oxygen-containing gas penetrates into the flowable silicon-and-nitrogen containing layer while avoiding premature curing of the flowable silicon-and-nitrogen containing layer;
    purging the oxygen-containing gas from the processing region using an inert gas; and
    after purging the oxygen-containing gas, exposing the soaked silicon-and-nitrogen containing layer to UV radiation, wherein the UV radiation at least partially cures the flowable dielectric layer.

19. The method of claim 18, wherein the temperature of the substrate is maintained at less than 150 degrees Celsius.

20. The method of claim 18, wherein the pressure in the processing region is maintained at greater than 100 Torr.

* * * * *